United States Patent [19]

Meri

[11] 3,825,850

[45] July 23, 1974

[54] DIRECT-COUPLED AUDIO AMPLIFIER HAVING UNBYPASSED EMITTER RESISTOR STAGES

[75] Inventor: Kalju Meri, Maspeth, N.Y.

[73] Assignee: Electrospace Corporation, Bronx, N.Y.

[22] Filed: Nov. 28, 1972

[21] Appl. No.: 310,028

[52] U.S. Cl. .......................... 330/19, 330/22, 330/23, 330/26, 330/32

[51] Int. Cl. .............................................. H03f 3/42

[58] Field of Search ............ 330/13, 16, 17, 22, 23, 330/25, 26, 28, 32

[56] References Cited

UNITED STATES PATENTS

| | | | |
|---|---|---|---|
| 3,207,999 | 9/1965 | Carruth et al. | 330/23 X |
| 3,239,770 | 3/1966 | Taber | 330/28 X |
| 3,517,324 | 6/1970 | Perlman | 330/19 X |

*Primary Examiner*—Herman Karl Saalbach
*Assistant Examiner*—Lawrence J. Dahl
*Attorney, Agent, or Firm*—Friedman & Goodman

[57] ABSTRACT

A single-ended high-voltage gain, direct-coupled audio amplifier has unbypassed emitter resistor stages. Two common-emitter NPN amplifying stages are followed by an inverted PNP emitter-follower output stage. The second amplifying stage has an unbypassed, low valued emitter resistor through which the collector current of the output stage passes to develop sufficient bias on the emitter of the second stage. Decoupled DC feedback is provided between the unbypassed resistor and the input base of the first amplifying stage.

14 Claims, 1 Drawing Figure

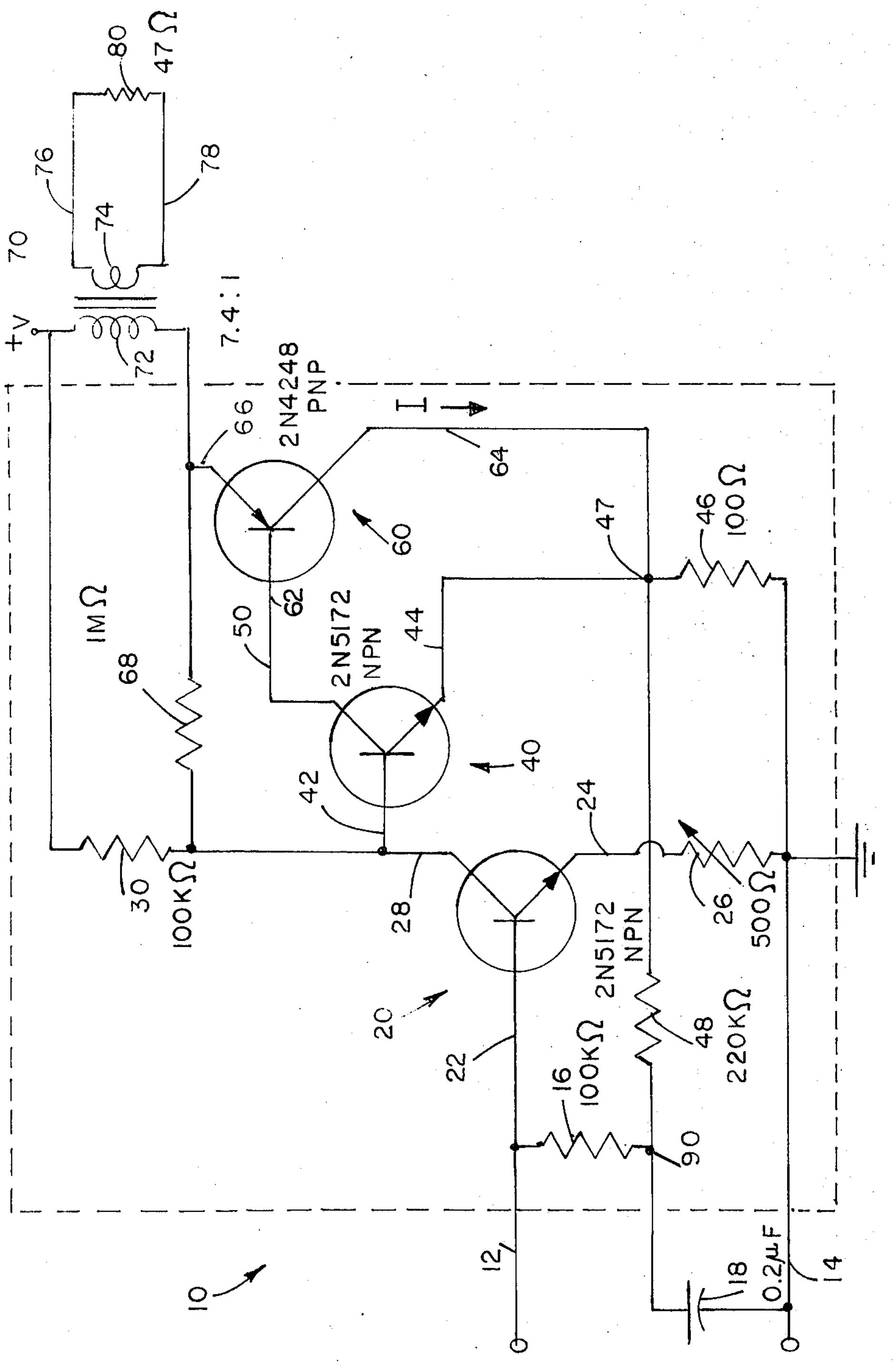
+V
70
72
74
76
78
80
47Ω
7.4:1
2N4248
PNP
I
64
66
60
62
50
2N5172
NPN
44
47
46
100Ω
1MΩ
68
40
42
24
26
500Ω
30
100KΩ
28
2N5172
NPN
20
22
48
220KΩ
16
100KΩ
90
12
18
0.2μF
14
10

DIRECT-COUPLED AUDIO AMPLIFIER HAVING UNBYPASSED EMITTER RESISTOR STAGES

BACKGROUND OF THE INVENTION

The present invention relates to amplifiers, and more particularly to a high-voltage gain, direct-coupled audio amplifier having unbypassed emitter resistor stages.

Various audio amplifier designs are already known. Many of the designs, however, require the use of coupling capacitors between successive stages, emitter bypass capacitors, or both. Frequently, the coupling and bypass capacitors are of the electrolytic type and consequently the assembled audio amplifier is both bulky as well as expensive to manufacture. Furthermore, electrolytic capacitors are the least reliable of all components commercially used in amplifiers in terms of reliability and durability. Electrolytics capacitors are known to fail after a relatively short lifespan. The most frequent failure of amplifiers is due to the common breakdown of electrolytic capacitors. Also, amplifying circuits which require capacitors, particularly electrolytic capacitors, are not well suited for integrated circuitry techniques since high valued capacitors cannot as yet be made according to these techniques and must subsequently be added externally of the integrated circuits. Again, the resulting audio circuits are bulky and expensive.

It should be pointed out, at this point, that amplifying stages commonly have resistors in their common-emitter configurations. In the prior art, the major reason for employing emitter resistors has been to temperature stabilize the transistors. All transistors are highly sensitive to temperature. If the junction temperature rises a few degrees, the current rises with it. This can change the gain of the stage and, worst of all, it can start a chain-reaction, in which the transistor keeps on getting hotter and hotter and drawing more and more current until it destroys itself. This is frequently termed "thermal run-away". The purpose of the emitter resistor is to control thermal run-away. As the collector current rises (which it will do if the junction temperature rises) there is a greater voltage drop across the emitter resistor. Since the transistor bias is between the emitter and base, this acts to reverse bias the transistor, and thus cut down on the excessive current. However, thermal run-away is a DC phenomena. Insofar as the AC signal is concerned, an unbypassed emitter resistor serves as a negative feedback element which decreases the gain of the amplifying stage. For this reason, emitter bypass capacitors have been used in the past to provide low impedance paths for the AC signals across the emitter resistors without developing AC voltages in the emitter circuits.

SUMMARY OF THE INVENTION

Accordingly, it is an object of the present invention to provide an audio amplifier which is not possessed of the above described disadvantages in connection with prior art audio amplifiers.

It is another object of the present invention to provide an audio amplifier which is simple in construction and economical to manufacture.

It is still another object of the present invention to provide an audio amplifier which has a high-voltage gain and which has unbypassed emitter resistor stages.

It is yet another object of the present invention to provide an audio amplifier as described above which is direct-coupled and which has unbypassed emitter resistor stages.

It is a further object of the present invention to provide an audio amplifier of the type under discussion which does not require any coupling or bypass capacitors.

It is still a further object of the present invention to provide an audio amplifier which does not utilize coupling or bypass capacitors but which is extremely temperature stable.

It is yet a further object of the present invention to provide a temperature stable audio amplifier which has a plurality of common emitter amplifying stages and an inverted emitter follower output stage.

It is an additional object of the present invention to provide an audio amplifier which is temperature stabilized by providing DC feedback from an output stage to the input stage — the DC feedback being decoupled to prevent deterioration of voltage gain.

It is still an additional object of the present invention to provide an audio amplifier whose next to the last stage emitter resistor may be of a very low resistance and thereby remain unbypassed as a result of passing high collector current from the output stage therethrough to develop sufficient bias for the emitter of the next to the last stage.

In order to achieve the above objects, as well as others which will become apparent hereafter, the present invention for a temperature stable high voltage gain, direct-coupled audio amplifier comprises an even number series of amplifying stages each having a transistor of the same polarity. An output stage is provided which is coupled to said series of stages and has a transistor of opposite polarity. The transistor of the last stage of the series has an unbypassed emitter resistor of relatively low resistance. The output stage has a transistor so connected to said unbypassed resistor so that the current of the output stage passes through the resistor and biasses the transistor of the last stage of the series. An AC decoupled DC feedback means is provided between the resistor and the first stage of the series for temperature stabilizing the amplifier.

According to a presently preferred embodiment, two amplifying stages and one single-ended output stage are provided, the transistors of said amplifying stages being of the NPN polarity while the transistor of said output stage being of the PNP polarity. Further, said output stage comprises an inverted emitter-follower stage, the collector of the transistor of said latter stage being connected to said unbypassed resistor. In this manner, the collector current of said output stage is arranged to pass through said unbypassed resistor to thereby establish an emitter bias potential for said last amplifying stage of said series.

The audio amplifier has an input terminal and a ground potential reference point. The DC feedback means comprises resistor means connected between the unbypassed resistor and the base of said first amplifying stage. A decoupling capacitor is connected between said resistor means and said reference point. Said decoupling capacitor has a capacitance sufficiently large so as to prevent AC feedback for the DC feedback means.

Advantageously, said unbypassed resistor has a value approximately in the range of 100–200 ohms — values typically one two-hundreth of values of conventional emitter resistors.

According to a presently preferred amplifier configuration, all said amplifying stages are common emitter stages while said output stage is an inverted emitter follower stage.

As will become more fully clear from the detailed description that follows, the audio amplifier in accordance with the present invention is extremely simple in construction and economical to manufacture. Since the amplifier does not require interstage coupling or bypass capacitors, the amplifier is particularly suitable for use in connection with integrated circuit techniques. In addition thereto, the audio amplifier has high voltage gain and good temperature stability.

BRIEF DESCRIPTION OF THE DRAWING

With the above and additional objects and advantages in view, as will hereinafter appear, this invention comprises the devices, combinations and arrangements of parts hereinafter described and illustrated in the accompanying drawing of a preferred embodiment in which:

The single FIGURE illustrates a schematic of the audio amplifier in accordance with the present invention.

DETAILED DESCRIPTION OF THE PREFERRED EMBODIMENT

Referring to the FIGURE, the amplifier in accordance with the present invention is generally designated by the reference numeral 10 and enclosed by the dashed outline. The amplifier 10 has input terminals 12 and 14, the terminal 14 being connected to a reference potential point, such as the circuit ground. Connected between the terminals 12, 14 are series connected resistor 16 and capacitor 18 which are connected to each other at a junction point 90. The function of the resistor — capacitor network will be described hereafter.

The input terminal 12 is connected to a transistor 20, namely to the base 22 thereof. The emitter 24 of the transistor 20 is connected to the ground reference potential through a variable resistor 26. The resistor 26 is in the form of a voltage gain control and may, if such control is not necessary, be omitted. When the resistor 26 is provided, its full resistance value may be kept relatively low such as, for example, 500 ohms. The collector 28 of the transistor 20 is connected to a positive potential +V through a collector resistor 30. The transistor 20, with the above described associated components, shall be referred to in the specification, as well as in the claims, as an amplifying stage. In the presently described embodiment, the transistor 20 has a polarity of the NPN type. However, the polarity of the transistor 20 is not critical, subject to the limitations to be described hereafter. It should also be noted, that because the resistance of the resistor 26 is relatively low, no bypass capacitor is required thereacross.

A second amplifying stage includes a transistor 40 whose base 42 is connected to the collector 28 of the transistor 20. The emitter 44 of the transistor 40 is connected to the circuit ground potential through an unbypassed emitter resistor 46 at a junction point 47. The resistor 46 forms an important part of the present invention and it is selected to have a resistance value which is relatively low in comparison to the impedance levels in the circuit, e.g. the input impedance or the collector impedances in the circuit. Preferably, the resistor 46 is selected to have value between 100 and 200 ohms.

Another important feature of the present invention is the provision of the DC feedback resistor 48 connected between the resistor 46 and the junction point 90 in the base circuit of the first transistor 20.

The transistor 40 is also of a NPN polarity — the same as the polarity of the transistor 20. The transistors 20 and 40 form a series of two amplifying stages. For reasons to be described hereafter, any number of comparable amplifying stages may be utilized, as long as the total number of amplifying stages is an even number.

The collector 50 of the transistor 40 — the last transistor of the series of amplifying stages — is connected to a transistor 60, namely the base 62 of the latter. The transistor 60 forms a single-ended output stage of the audio amplifier. Whereas, the amplifying stages including transistors 20 and 40 are common emitter stages, the output stage is in the nature of an inverted emitter follower circuit. Further important features of the present invention include, firstly, the feature that the polarity of the transistor 60 is of the PNP type polarity — opposite of the polarities of the amplifying stage transistors in the series. Secondly, the collector 64 of the transistor 60 is connected to the junction point 47 across the resistor 46. The significance of such configuration will be further described hereafter in connection with the operation of the amplifier.

The emitter 66 of the transistor 60 is connected to the base 42 of the transistor 40 by way of an AC feedback resistor 68. The resistor 68 has a very high resistance, in the order of one megohm.

Connected between the emitter 66 of the transistor 60 and the positive potential +V is an output coupling transformer 70 having a primary winding 72 connected in series with the emitter 66 and coupled to a secondary winding 74. Output terminals 76, 78 are connected to the secondary winding 74. A load resistor 80 is shown connected to the output terminals 76, 78.

The operation of the audio amplifier will now be described. When a signal is applied to between the input terminals 12, 14, a corresponding signal is applied between the base 22 and the emitter 24 of the first amplifying stage transistor 20. The input signal is amplified in accordance with principles well known in the art — the gain of the first amplifying stage being a function of the resistor 26 setting which determines the amount of negative feedback applied to the first amplifying stage.

The signal amplified by the transistor 20 of the first amplifying stage is next applied to the base 42 of the second amplifying stage, including transistor 40 where it is again amplified. As with the transistor 20, the emitter resistor 46 associated with the transistor 40 is selected to have a low value, e.g. 100 ohms, so that a bypass capacitor is not necessary across the resistor 46. The DC emitter current of the second amplifying stage is normally very low, in the order of 60 microamperes. Consequently, in the prior art, emitter resistors are made to have high resistance values so that the low DC current may develop sufficient emitter bias for the transistor 40. It is the high resistance emitter resistors which require bypassing in the prior art. With the present amplifier, the emitter resistor is made to have a low resistance value but the current which passes therethrough is boosted significantly so as to nevertheless develop sufficient bias for the emitter 44. This is accomplished by connecting the collector 64 of the transistor 60 in the output stage to the junction point 47. Since the resistor 46 is of much smaller resistance than that of the resistor 48, most of the collector current I in the output stage passes through the resistor 46 to ground. Typically, the current I is on the order of 10 milliamperes when the supply voltage +V is +20 volts. Thus, if the resistor 46 is made equal to 100 ohms, +1 volt is developed at the junction 47. However, since the resistor 46 is only on the order of 100 ohms, no bypass capacitor is necessary for AC signals.

As described above, no bypass capacitor is placed across the emitter resistor 26 of the first amplifying stage since that resistor is of low value. However, the thermal stability of the first amplifying stage, as well as of the other stages, is greatly enhanced by the addition of DC feedback resistor 48. The DC voltage, monitored at the junction point 47, is applied to the base 22 of the transistor 20. Any AC signals appearing at the junction point 47 are first decoupled by the decoupling capacitor 18. This capacitor need not be of high capacitance since it is placed in a very high impedance circuit. For example, the resistor 16 may equal approximately 100 kilohms, while the resistor 48 can be on the order of 220 kilohms. According to one presently preferred embodiment, the capacitor 18 is made equal to approximately 0.2 microfarads. Consequently, the capacitor 18 may be a conventional capacitor instead of an electrolytic.

The audio amplifier as described above has a relatively low power supply current drain — whatever current is drawn from the power supply being substantially equal to the collector current I of the transistor 60. The amplifying stages themselves draw very little current — each on the order of 50 to several hundred micro-amps.

The above described circuit has been illustrated and described as having suggested component values. However, it should be noted that these values are merely illustrative and values other than those given may still be utilized which produce similar or comparable desired results. Accordingly, the specific values given are not critical and other combinations of values are intended to come within the scope and spirit of the present invention.

With the illustrative values given, the amplifier has a nominal voltage gain of 74db when the resistor 26 is elected to be equal to zero ohms and the resistor 68 is selected to be one megohm, the latter providing 8db of negative feedback. Pertinent operating test data describing the performance characteristics of the audio amplifier will now be given.

Frequency Response (db) with 600 ohm generator—Nominal voltage gain of +74 db

| R26 | C18 | 100Hz | 150 | 200 | 300 | 400 | 1kHz | 2 | 4 | 6 | 10kHz |
|---|---|---|---|---|---|---|---|---|---|---|---|
| 100Ω | 0.2μF | −17 | +4 | +6 | +0.5 | −0.3 | 0db | 0 | −1 | −2 | −5 |
| 0Ω | 0.2μF | −23 | −10 | +5 | +2.5 | +0.5 | 0db | 0 | −1 | −2 | −5 |
| 0Ω | 0.4μF | −10 | 0 | −1 | −1.5 | −1 | 0db | 0 | 0 | −0.5 | −2 |

The above frequency response data has been taken with a 600 ohm generator. The frequency response is given as a function of different values of gain control resistor 26 and decoupling capacitor 18. Examining the first frequency response between 200 Hertz and 10 kilohertz, it is noted that the gain varies from +6db at 200 Hz. to −5db at 10 kilohertz. When resistor 26 is made equal to zero ohms, the gain varies by +5db at 200 Hertz to −5db at 10 kilohertz. In both of the above tests, the capacitor 18 was 0.2 microfarads. When the capacitor 18 is increased to 0.4 microfarads, the gain variation decreases — going from −1db at 200 Hertz to −2db at 10 kilohertz. It will be noted that for lower values of the capacitor 18, there is a base boost below approximately 400 Hz. This may be desirable in certain audio amplifiers. When a more symmetrical response is desired, wherein the gain drops more uniformely to the sides of the center frequency of approximately 1 kilohertz, the decoupling capacitor 18 may be somewhat increased in value.

Gain Control as a Function of the value of the Resistor 26

| | 0Ω | 100Ω | 330Ω | 500Ω | 1kΩ |
|---|---|---|---|---|---|
| db level | 0db | −5 | −10 | −14 | −18db |
| DC mA. | 10.0mA. | 10.2 | 10.5 | 11.0 | 11.6mA. |

The gain as a function of the gain control resistor 26 is given in the above table. It will be noted that the maximum gain occurs when the gain control resistor 26 is selected to have zero ohms. As the resistor 26 is increased in resistance, the voltage gain continues to drop. However, it should be noted that irrespective of the gain setting of the resistor 26, the DC current which is drawn from the power supply, most of which is manifested in the collector current I of the transistor 60, remains relatively fixed at approximately 10–11 milliamperes. Thus, since the current I remains substantially fixed, the above described advantates associated with having the current I passing through the resistor 46 are obtained irrespective of the gain setting of the amplifier.

Heat-Test From 0° to 160° F.

| | 0°F. | 25°F. | 75°F. | 160°F. |
|---|---|---|---|---|
| total DC mA. | 14.2mA. | 13.5mA. | 10.6mA. | 8.8mA. |
| relative signal | −0.7db | −0.5db | 0db | −0.3db |

The above table gives the temperature stability data of the amplifier under consideration. As will be noted, the temperature tests are for temperatures between 0°F. and 160°F. Over this wide temperature range, the gain varies by −0.7db at 0°F. to 0db variation from the nominal gain at 75°F. This very small gain variation constitutes a very desirable characteristic of the amplifier. Examining the total DC current drawn from the power supply, it will be noted that the current actually decreases from 14.2 milliamperes at 0°F. to 8.8 milliamperes at 160°F. As explained in the background of the invention, amplifier characteristics are normally such that the currents increase with increasing temperature. Here, by selecting a suitable value for the resistor 46, the amplifier is actually over-compensated for temperature so that the current decreases with increasing temperature. The above-described good temperature stability characteristics are obtained without adding additional costly circuit elements, such as thermistors — often required by prior art amplifiers.

It should also be pointed out at this time that the present amplifier includes a series of two amplifying transistor stages and one output transistor stage. As already suggested above, any number of amplifying transistor stages may be provided in the series as long as the total number, aside from the output stage, is even. The purpose for this requirement is to maintain the proper phases for purposes of AC feedback. Also, while the amplifying stage transistors have been shown to be NPN type transistors and the output stage transistor has been described as being a PNP transistor, the polarities can be reversed so that the amplifying stage transistors are all PNP, while the output stage transistor is NPN.

As also suggested above, the present audio amplifier, enclosed by the dashed outline, is suitable and can easily be manufactured according to integrated circuit techniques. A single capacitor 18, which must not be of the electrolytic variety, need be connected to the amplifier. Thus, in accordance with a presently preferred embodiment, the entire amplifier enclosed by the dashed outline is manufactured in accordance with integrated circuit techniques. In the past, integrated circuit amplifiers in accordance with the prior art have required numerous coupling and bypassing capacitors many of which were of the electrolytic variety. For example, see General Electric data sheet PA 222 (85.20), dated June 1967, FIGS. 6 and 7.

Numerous alterations of the structure herein disclosed will suggest themselves to those skilled in the art. However, it is to be understood that the present disclosure relates to a preferred embodiment of the invention which is for purposes of illustration only and is not to be construed as a limitation of the invention.

What is claimed is:

1. A direct-coupled amplifier having unbypassed emitter resistor stages comprising an even number of amplifying stages each having a transistor of the same polarity; an output stage coupled to said series of stages and having a transistor of opposite polarity, the last stage of the series being provided with a resistor of relatively low resistance unbypassed by a low impedance network, said output stage transistor having the collector thereof connected to said unbypassed resistor, whereby the collector current of said output stage is arranged to pass through said unbypassed resistor to establish sufficient bias potential for said last amplifying stage of said series.

2. An audio amplifier as defined in claim 1, further comprising temperature stabilizing means including DC feedback means provided between the resistor and the first stage of the series for temperature stabilizing the amplifier.

3. An audio amplifier as defined in claim 1, wherein two amplifying stages are provided in addition to the one output stage.

4. An audio amplifier as defined in claim 1, wherein the transistors of said amplifying stages are of NPN polarity, and wherein the transistor of said output stage is of PNP polarity.

5. An audio amplifier as defined in claim 1, wherein said output stage comprises an emitter-follower stage, the collector of the transistor of said latter stage being connected to said unbypassed resistor, whereby the collector current of said output stage is arranged to pass through said unbypassed resistor to thereby establish an emitter bias potential for said last amplifying stage of said series.

6. An audio amplifier as defined in claim 2, wherein the audio amplifier has an input terminal and a ground potential reference point, and wherein said DC feedback means comprises resistor means connected between said unbypassed resistor and the base of said first amplifying stage, and further comprising AC decoupling means connected between said resistor means and said reference point.

7. An audio amplifier as defined in claim 6, wherein said AC decoupling means comprises a capacitor having a capacitance sufficiently large so as to substantially prevent AC feedback through said DC feedback means.

8. An audio amplifier as defined in claim 1, further comprising AC feedback means connected between the output electrode of the output stage transistor and an electrode of the transistor of the first amplifying stage of said series of amplifying stages.

9. An audio amplifier as defined in claim 1, wherein the values of conventional emitter resistors in audio amplifying stages are typically within a predetermined range, and wherein said unbypassed resistor has a value approximately one-two hundreth of the values of said predetermined range.

10. An audio amplifier as defined in claim 1, wherein said unbypassed resistor has a value approximately in the range of 100–200 ohms.

11. An audio amplifier as defined in claim 1, wherein all said amplifying stages are common emitter stages while said output stage is an inverted emitter follower stage.

12. An audio amplifier as defined in claim 1, wherein said output stage comprises an inverted emitter-follower stage, and further comprises transformer output coupling means connected to the emitter of said inverted stage.

13. An audio amplifier as defined in claim 1, wherein the audio amplifier is constructed as an integrated circuit.

14. An audio amplifier as defined in claim 1, wherein said output stage is single-ended.

* * * * *